(12) United States Patent
Tange

(10) Patent No.: US 8,702,891 B2
(45) Date of Patent: Apr. 22, 2014

(54) METHOD FOR MANUFACTURING GLASS-SEALED PACKAGE, APPARATUS FOR MANUFACTURING GLASS-SEALED PACKAGE, AND OSCILLATOR

(75) Inventor: Yoshihisa Tange, Chiba (JP)

(73) Assignee: Seiko Instruments Inc., Chiba (JP)

(*) Notice: Subject to any disclaimer, the term of this patent is extended or adjusted under 35 U.S.C. 154(b) by 1113 days.

(21) Appl. No.: 12/701,110

(22) Filed: Feb. 5, 2010

(65) Prior Publication Data

US 2010/0207698 A1 Aug. 19, 2010

(30) Foreign Application Priority Data

Feb. 13, 2009 (JP) ................................. 2009-031617

(51) Int. Cl.
   *B29C 65/00* (2006.01)
(52) U.S. Cl.
   USPC ....................................... 156/252; 156/379.6
(58) Field of Classification Search
   USPC .......... 156/252, 379.6; 310/344, 340; 77/344, 77/346, 370
   See application file for complete search history.

(56) References Cited

U.S. PATENT DOCUMENTS

| 6,407,485 B1* | 6/2002 | Aratake | 310/344 |
| 2004/0169020 A1* | 9/2004 | Yamauchi | 219/121.46 |
| 2010/0207698 A1* | 8/2010 | Tange | 331/158 |

FOREIGN PATENT DOCUMENTS

JP 2006-339896 A 12/2006

* cited by examiner

*Primary Examiner* — Joseph Chang
*Assistant Examiner* — Jeffrey Shin
(74) *Attorney, Agent, or Firm* — Brinks Gilson & Lione

(57) ABSTRACT

The invention provides a method and an apparatus for manufacturing a glass-sealed package, whereby anodic bonding of a pair of wafers is ensured over substantially the whole area of the wafers, and whereby a vacuum is ensured inside the cavity during the anodic bonding of the wafers. The invention also provides an oscillator having such characteristics. The manufacturing method of a glass-sealed package includes the step of anodically bonding a pair of wafers by applying voltage to positions corresponding to circumferential portions of the wafers stacked in layers, and the step of dividing the pair of anodically bonded wafers into individual pieces. A through hole is formed at a central portion of at least one of the wafers, and the anodic bonding of the wafers is made by applying voltage using a plurality of electrodes disposed at the positions corresponding to the circumferential portions of the wafers.

5 Claims, 14 Drawing Sheets

METHOD FOR MANUFACTURING GLASS-SEALED PACKAGE, APPARATUS FOR MANUFACTURING GLASS-SEALED PACKAGE, AND OSCILLATOR

RELATED APPLICATIONS

This application claims priority under 35 U.S.C.§119 to Japanese Patent Application No. 2009-031617 filed on Feb. 13, 2009, the entire content of which is hereby incorporated by reference.

FIELD OF THE INVENTION

The present invention relates to a method for manufacturing a glass-sealed package, an apparatus for manufacturing a glass-sealed package, and an oscillator.

BACKGROUND ART

Recently, a glass-sealed package has gained attention that includes a base substrate and a lid substrate, both made of glass, anodically bonded in layers with a cavity formed therebetween, and an active piece mounted on the base substrate in a portion inside the cavity. One known example of the glass-sealed package of this type is the piezoelectric vibrator that uses crystals or other materials for applications such as a clock source, a timing source of control signals or the like, and a reference signal source by being installed in, for example, cellular phones and personal digital assistant units.

The glass-sealed package of this type is produced by anodically bonding a base substrate wafer and a lid substrate wafer via a bonding film made of a conductive material for anodic bonding, with the wafers set in an anodic bonding machine installed in a vacuum chamber.

Specifically, the bonding face of the lid substrate wafer includes large numbers of depressions that provide cavities when the lid substrate wafer is mated with the base substrate wafer. On the bonding face of the base substrate wafer, large numbers of active pieces (for example, piezoelectric vibrating pieces) that correspond to the depressions are mounted, and a bonding film is formed on this bonding face except in portions corresponding to the depressions. The lid substrate wafer is set on an electrode plate of the anodic bonding machine.

Next, while activating the ions in the lid substrate wafer by heating, voltage is applied between the bonding film and the electrode plate to flow current in the lid substrate wafer and thereby cause an electrochemical reaction at the interface between the bonding film and the bonding face of the lid substrate wafer, thus anodically bonding the two to form bonded wafers.

The bonded wafers are then cut at predetermined positions to form a plurality of product packages (see, for example, JP-A-2006-339896).

SUMMARY OF THE INVENTION

In a known manufacturing method of a glass-sealed package, because the voltage for anodic bonding is applied at positions corresponding to circumferential portions of the lid substrate wafer (circumferential portions of the bonding film), anodic bonding proceeds from parts of the circumferential portions of the lid substrate wafer where the voltage is applied. For example, when voltage is applied at two locations symmetrical to the central portion of the lid substrate wafer, distortion may occur at the central portion of the lid substrate wafer. The distortion may weaken the bond strength at the central portion compared with the other portions, or may result in a loss of bonding at the central portion.

There are also cases where the oxygen gas generated between the wafers accumulates at the central portion during anodic bonding. In this case, the degree of vacuum inside the cavity may be reduced in glass-sealed packages obtained in areas near the central portion, and the products may fail to exhibit the desired performance.

The present invention has been made under these circumstances, and an object of the present invention is to provide a method and an apparatus for manufacturing a glass-sealed package, whereby anodic bonding of a pair of wafers is ensured over substantially the whole area of the wafers, and whereby a vacuum is ensured inside the cavity during the anodic bonding of the wafers. The invention also provides an oscillator having such characteristics.

In order to solve the foregoing problems, the present invention provides the following:

A method for manufacturing a glass-sealed package, including the steps of:

anodically bonding a pair of wafers by applying voltage at positions corresponding to circumferential portions of the wafers stacked in layers; and dividing the pair of anodically bonded wafers into individual pieces, wherein a through hole is formed at a central portion of at least one of the wafers, and wherein the anodic bonding is made by applying voltage to a plurality of electrodes disposed at positions corresponding to the circumferential portions of the wafers.

With this configuration, distortion can be prevented that may occur at the central portion of the wafers during the anodic bonding made at a plurality of locations in the circumferential portions of the wafers. Specifically, because the through hole formed at the central portion of the wafers provides an escape for the distortion in the wafers, anodic bonding is ensured over substantially the whole area of the wafers. This enables stable anodic bonding for the wafers, and suppresses reduction in yield.

Further, because the anodic bonding employs a plurality of electrodes, anodic bonding is ensured over substantially the whole area of even larger wafers.

In another aspect of a method for manufacturing a glass-sealed package according to the present invention, the plurality of electrodes is disposed at positions equally spaced apart along a circumferential direction with respect to the central portion of the wafers.

With this configuration, distortion can be prevented that may occur at the central portion of the wafers during the anodic bonding made at a plurality of locations in the circumferential portions of the wafers. Further, by the provision of the electrodes disposed at positions equally spaced apart along a circumferential direction with respect to the central portion of the wafers, the misalignment that occurs during wafer bonding and causes distortion in the wafers can take place at the central portion. Specifically, because the through hole formed at the central portion of the wafers provides an escape for the distortion in the wafers, anodic bonding is ensured over substantially the whole area of the wafers. This enables stable anodic bonding for the wafers, and suppresses reduction in yield.

Further, because the anodic bonding employs a plurality of electrodes, anodic bonding is ensured over substantially the whole area of even larger wafers.

In another aspect of a method for manufacturing a glass-sealed package according to the present invention, the through hole is formed in a devoid region of the glass-sealed package in the wafers.

With this configuration, because the through hole is formed in the devoid region generally provided for the glass-sealed package to provide rigidity for the wafers, there will be no reduction in the number of glass-sealed packages that can be produced from the pair of wafers. Thus, the glass-sealed package can be produced without lowering production efficiency while ensuring anodic bonding.

In another aspect of a method for manufacturing a glass-sealed package according to the present invention, the pair of wafers is anodically bonded by being held between a pair of jigs, and the jigs include a gas vent in communication with the through hole.

With this configuration, the gas (oxygen) generated during anodic bonding is channeled to the central portion of the wafers, and always released from the through hole at the central portion of the wafers through the gas vent of the jig. It is therefore ensured that the cavity (space created between the pair of wafers) is maintained in a vacuum during the anodic bonding of the wafers.

A manufacturing apparatus of a glass-sealed package according to the present invention is an apparatus for manufacturing a glass-sealed package by anodically bonding a pair of wafers through application of voltage at positions corresponding to circumferential portions of the wafers stacked in layers, and by dividing the pair of anodically bonded wafers into individual pieces, wherein the apparatus includes a plurality of electrodes disposed to apply voltage at positions equally spaced apart along a circumferential direction with respect to a central portion of the wafers being anodically bonded.

With this configuration, anodic bonding can be made from a plurality of locations in the circumferential portions of the wafers. That is, the current applied per location becomes smaller, and anodic bonding is ensured over substantially the whole area of even larger wafers.

In another aspect, a manufacturing apparatus of a glass-sealed package according to the present invention includes a pair of jigs between which the pair of wafers in at least one of which a through hole is formed at the central portion of the wafers is held together, wherein the jigs include a gas vent in communication with the through hole.

With this configuration, it is ensured that the gas (oxygen) generated during anodic bonding is released from the through hole at the central portion of the wafers through the gas vent of the jig. It is therefore ensured that the cavity (space created between the pair of wafers) is maintained in a vacuum during the anodic bonding of the wafers.

An oscillator according to the present invention includes: a piezoelectric vibrator including a piezoelectric vibrating piece housed inside a glass-sealed package manufactured by any of the manufacturing methods above, wherein the piezoelectric vibrator is electrically connected as a resonator to an integrated circuit.

Because an oscillator according to the present invention uses the piezoelectric vibrator completely sealed air-tight by the anodic bonding, a high-quality oscillator with stable electrical characteristics can be provided.

According to a manufacturing method of a glass-sealed package according to the present invention, distortion can be prevented that may occur at the central portion of the wafers during the anodic bonding made at a plurality of locations in the circumferential portions of the wafers. Specifically, because the through hole formed at the central portion of the wafers provides an escape for the distortion in the wafers, anodic bonding is ensured over substantially the whole area of the wafers. This enables stable anodic bonding for the wafers, and suppresses reduction in yield.

Further, because the anodic bonding employs a plurality of electrodes, anodic bonding is ensured over substantially the whole area of even larger wafers.

DETAILED DESCRIPTION OF THE PREFERRED EMBODIMENTS

Figure 1:
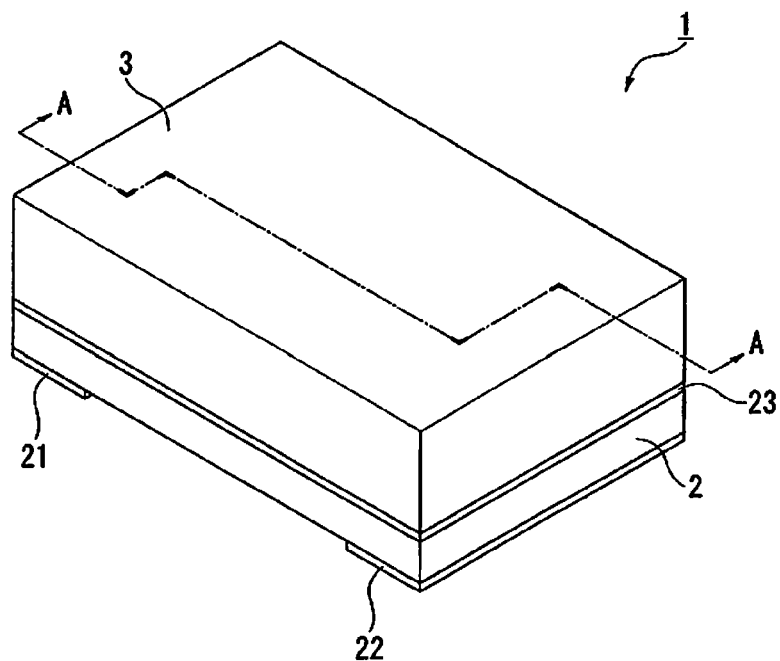
FIG. 1 is an external perspective view of a piezoelectric vibrator of an embodiment of the present invention.

An embodiment of the present invention is described below with reference to FIG. 1 to FIG. 18. The present embodiment describes a piezoelectric vibrator manufactured as a glass-sealed package.

As illustrated in FIG. 1 to FIG. 4, a piezoelectric vibrator 1 is a surface-mounted piezoelectric vibrator including a base substrate 2 and a lid substrate 3 stacked together in two layers in the form of a box, and a piezoelectric vibrating piece 4 housed in a cavity 16 formed inside the vibrator.

Figure 4:
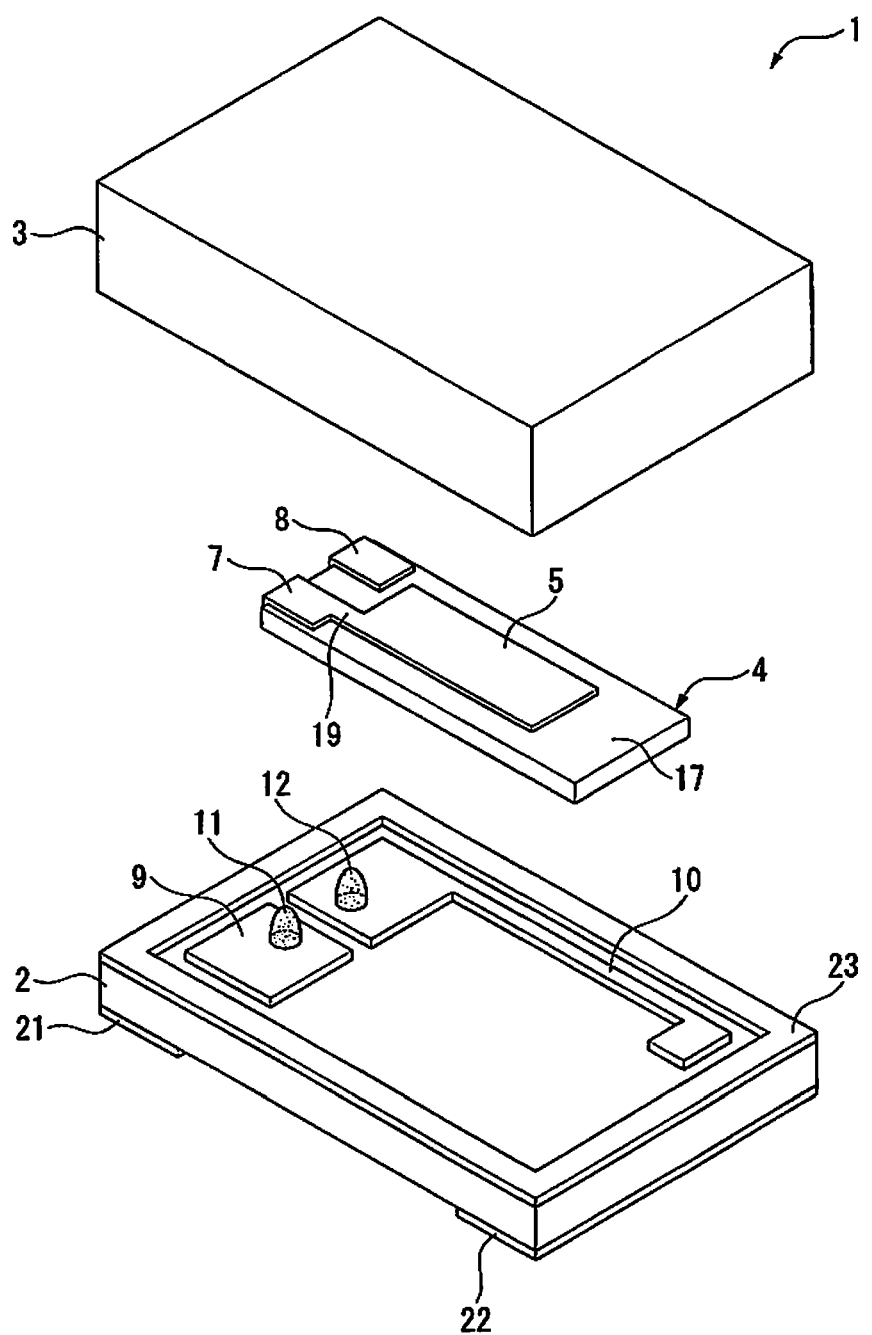
FIG. 4 is an exploded perspective view of a piezoelectric vibrator of an embodiment of the present invention.

In FIG. 4, through electrodes 13 and 14, and through holes 24 and 25, described later, are not illustrated for ease of illustration.

The piezoelectric vibrating piece 4 is an AT-cut vibrating piece formed from a crystal of piezoelectric material, and vibrates in response to an applied predetermined voltage.

The piezoelectric vibrating piece 4 includes a crystal plate 17 substantially rectangular in shape in a planar view and having a uniform thickness, a pair of excitation electrodes 5 and 6 disposed on the opposing faces of the crystal plate 17, extraction electrodes 19 and 20 electrically connected to the excitation electrodes 5 and 6, and mount electrodes 7 and 8 electrically connected to the extraction electrodes 19 and 20. The mount electrode 7 is electrically connected to a side electrode 15 of the crystal plate 17 so as to be electrically connected to the mount electrode 7 formed on the side of the crystal plate 17 where the excitation electrode 6 is provided.

The excitation electrodes 5 and 6, the extraction electrodes 19 and 20, the mount electrodes 7 and 8, and the side electrode 15 are formed as conductive film coatings of, for example, chromium (Cr), nickel (Ni), gold (Au), aluminum (Al), or titanium (Ti), or as laminated films of such conductive films.

The piezoelectric vibrating piece 4 structured as above is bump bonded on an upper surface of the base substrate 2 using bumps 11 and 12 made of, for example, gold. Specifically, the piezoelectric vibrating piece 4 is bump bonded with the mount electrodes 7 and 8 respectively in contact with the bumps 11 and 12 respectively formed on inner electrodes 9 and 10 (described later) patterned on the upper surface of the base substrate 2. In this way, the piezoelectric vibrating piece 4 is supported by being suspended above the base substrate 2 with the distance corresponding to the thickness of the bumps 11 and 12, with the mount electrodes 7 and 8 and the inner electrodes 9 and 10 being electrically connected to each other, respectively.

The lid substrate 3 is a substrate made of a glass material, for example, soda-lime glass. On the side of the surface bonded to the base substrate 2 is provided a rectangular depression (cavity) 16 where the piezoelectric vibrating piece 4 is housed. The depression 16 is formed to provide a cavity when the base substrate 2 and the lid substrate 3 are mated, thus providing the cavity 16 for housing the piezoelectric vibrating piece 4. The lid substrate 3 is anodically bonded to the base substrate 2 with the depression 16 facing the base substrate 2.

The base substrate 2 is a substrate made of a glass material, for example, soda-lime glass. The base substrate 2 is substantially planar in shape, and sized to be mated with the lid substrate 3.

The base substrate 2 includes a pair of through holes 24 and 25 formed through the base substrate 2. One end of the through holes 24 and 25 opens into the cavity 16. Specifically, the through hole 24 is provided on the side of the mount electrodes 7 and 8 of the piezoelectric vibrating piece 4 mounted in position, and the other through hole 25 is provided on the opposite side from the mount electrodes 7 and 8 of the piezoelectric vibrating piece 4. Further, the through holes 24 and 25 are provided through the base substrate 2 substantially cylindrically, parallel to the thickness direction of the base substrate 2. The through holes 24 and 25 may be tapered to gradually increase or decrease their diameters towards the lower surface of the base substrate 2, for example.

In the through holes 24 and 25, a pair of through electrodes 13 and 14 is provided, plugging the through holes 24 and 25. The through electrodes 13 and 14 are provided to close the through holes 24 and 25 and thereby maintain the cavity 16 air-tight, and to provide conduction between external electrodes 21 and 22 (described later) and the inner electrodes 9 and 10, respectively. The gaps between the through holes 24 and 25 and the through electrodes 13 and 14 are completely closed with a glass frit material (not shown) having substantially the same coefficient of thermal expansion as the glass material used for the base substrate 2.

The upper surface side (the side bonded to the lid substrate 3) of the base substrate 2 are patterned with a bonding film 23 for anodic bonding, and the inner electrodes 9 and 10, using a conductive material (for example, such as aluminum and silicon). The bonding film 23 is formed along the periphery of the base substrate 2, surrounding the depression 16 formed in the lid substrate 3.

The inner electrodes 9 and 10 are patterned to provide electrical interconnections between the one through electrode 13 and the one mount electrode 7 of the piezoelectric vibrating piece 4, and between the other through electrode 14 and the other mount electrode 8 of the piezoelectric vibrating piece 4. Specifically, the one inner electrode 9 is formed directly above the one through electrode 13 on the side of the mount electrodes 7 and 8 of the piezoelectric vibrating piece 4. The other inner electrode, the inner electrode 10, is formed directly above the other through electrode 14 by being routed along the piezoelectric vibrating piece 4 from the position adjacent to the one inner electrode 9 to the side opposite from the through electrode 13 appearing on the base substrate 2.

The bumps 11 and 12 are formed on the inner electrodes 9 and 10, and the piezoelectric vibrating piece 4 is mounted using the bumps 11 and 12. This provides conduction between the one mount electrode 7 of the piezoelectric vibrating piece 4 and the one through electrode 13 via the one inner electrode 9, and between the other mount electrode 8 and the other through electrode 14 via the other inner electrode 10.

On the lower surface of the base substrate 2 are provided external electrodes 21 and 22 electrically connected to the through electrodes 13 and 14, respectively. Specifically, one of the external electrodes, the external electrode 21, is electrically connected to the first excitation electrode, 5, of the piezoelectric vibrating piece 4 via the one through electrode 13 and the one inner electrode 9. The other external electrode, the external electrode 22, is electrically connected to the second excitation electrode, 6, of the piezoelectric vibrating piece 4 via the other through electrode 14 and the other inner electrode 10.

The piezoelectric vibrator 1 structured as above is activated by applying a predetermined drive voltage to the external electrodes 21 and 22 formed on the base substrate 2. In response, current flows through the first and second excitation electrodes 5 and 6 of the piezoelectric vibrating piece 4, causing vibration at a predetermined frequency. The vibration can then be used as the timing source of control signals, or the reference signal source.

The following describes an anodic bonding machine used to manufacture a plurality of piezoelectric vibrators 1 at once using a base substrate wafer 40 and a lid substrate wafer 50.

Figure 5:
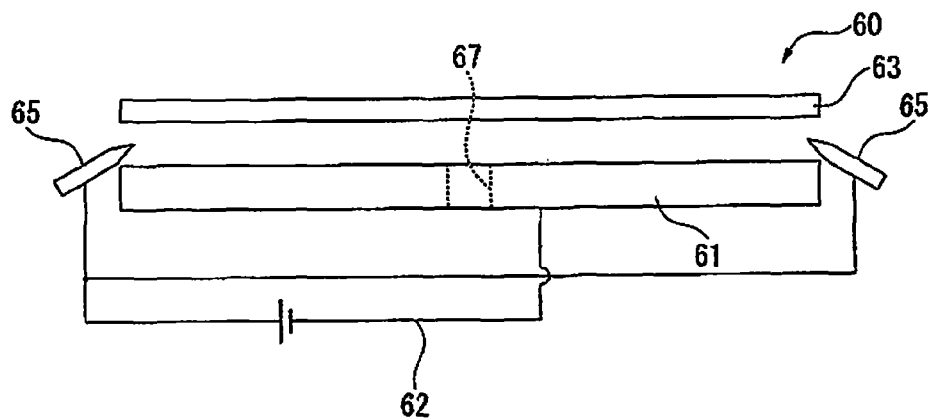
FIG. 5 is a schematic diagram (side view) illustrating a structure of an anodic bonding machine of an embodiment of the present invention.
Figure 6:
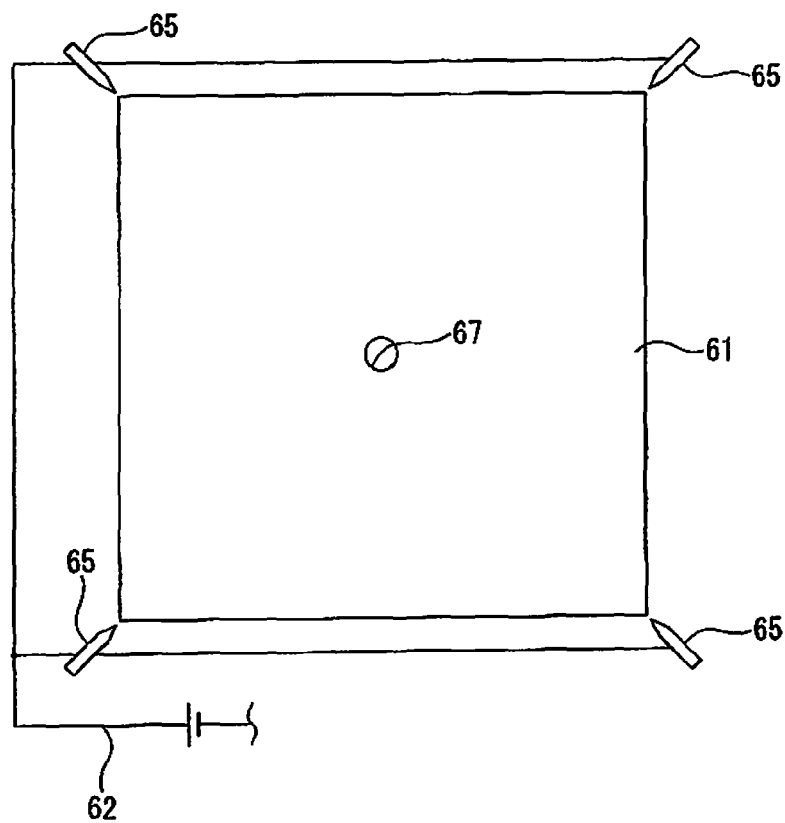
FIG. 6 is a schematic diagram (plan view without an upper jig) illustrating a structure of an anodic bonding machine of an embodiment of the present invention.

As illustrated in FIG. 5, an anodic bonding machine 60 includes a lower jig 61 that has an area larger than the lid substrate wafer 50, and an upper jig 63 disposed to face the lower jig 61 and having an area larger than the base substrate wafer 40. The lower jig 61 serves as the minus terminal, and is therefore connected to one end of a power wire 62. The other end of the power wire 62 is provided with electrodes 65. The electrodes 65 serve as the plus terminal. Further, the electrodes 65 are adapted to be connectable to the bonding film 23. In the present embodiment, four electrodes 65 are provided. That is, voltage can be applied to the bonding film 23 at four locations. As illustrated in FIG. 6, a substantially circular gas vent 67 is formed at substantially the central portion of the lower jig 61 of the present embodiment, as viewed in a planar view. The gas vent 67 is formed so that it is in communication with a through hole 51 (described later) when the lid substrate wafer 50 is placed on the lower jig 61.

Figure 7:
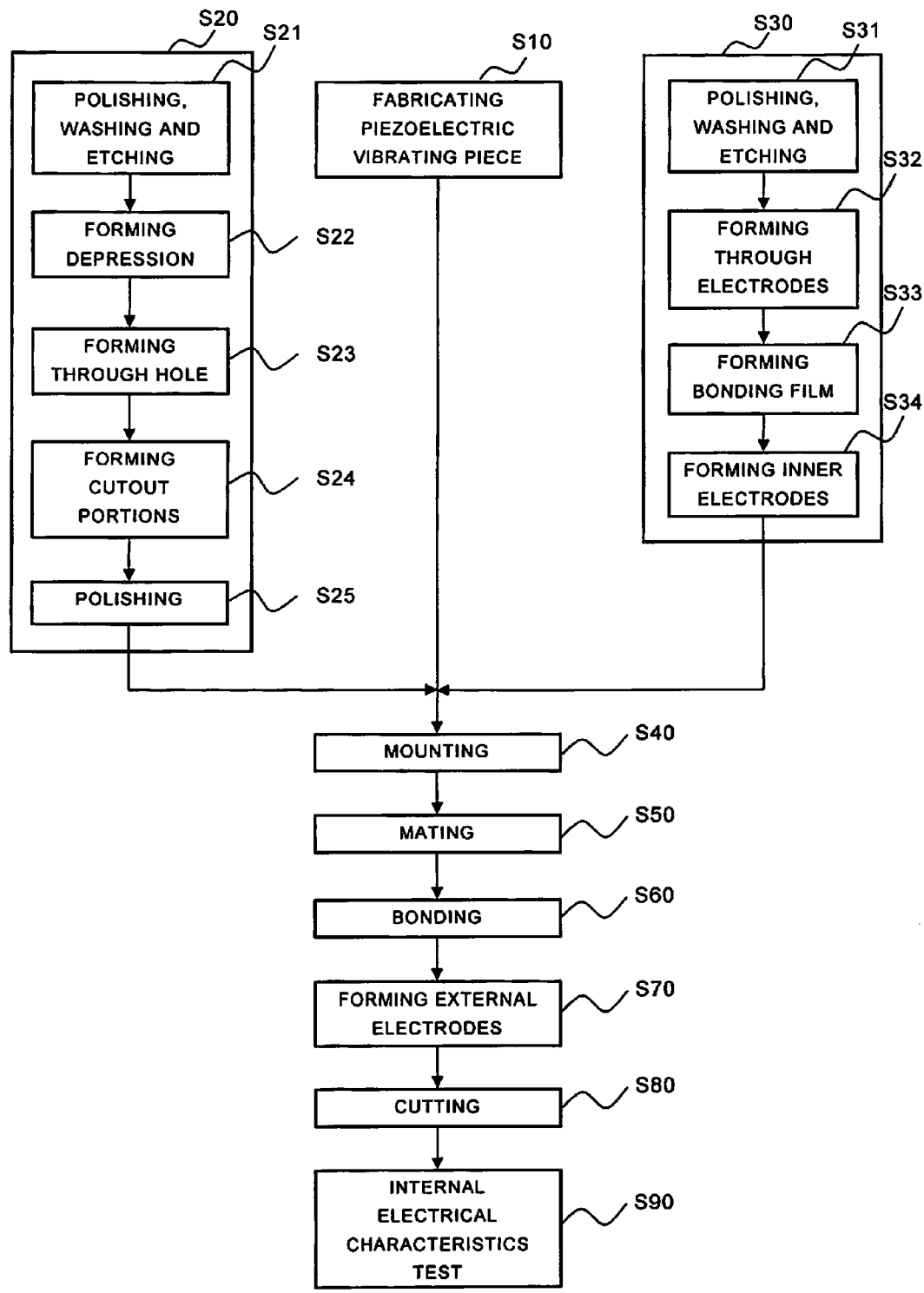
FIG. 7 is a flow chart representing a flow of the manufacture of a piezoelectric vibrator of an embodiment of the present invention.

The following describes a method for manufacturing a plurality of piezoelectric vibrators 1 at once using a base substrate wafer 40 and a lid substrate wafer 50, with reference to the flow chart of FIG. 7.

Figure 2:
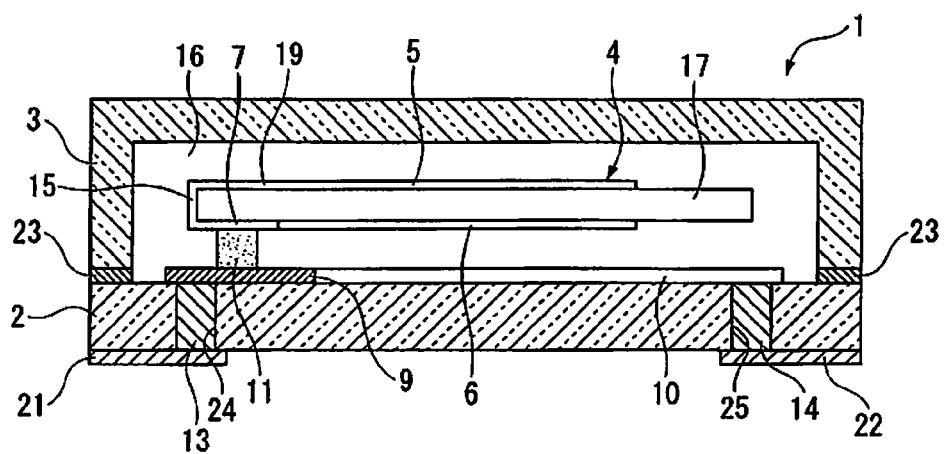
FIG. 2 is a cross sectional view taken along the line A-A of FIG. 1.
Figure 3:
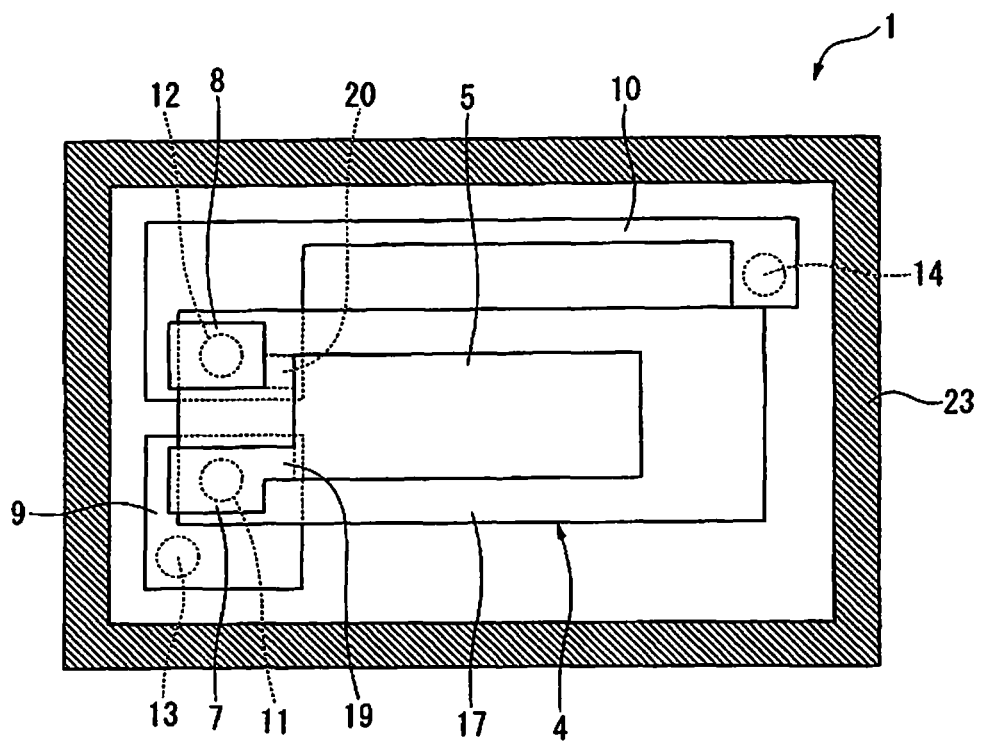
FIG. 3 is an internal schematic diagram of the piezoelectric vibrator illustrated in FIG. 1, showing a piezoelectric vibrating piece without a lid substrate as viewed from above.

First, the piezoelectric vibrating piece 4 illustrated in FIG. 2 to FIG. 4 is fabricated in a piezoelectric vibrating piece fabrication step (S10). Specifically, a crystal of a Lumbered quartz bar is sliced at a predetermined angle to provide a wafer of a constant thickness. The wafer is then coarsely processed by lapping, and mirror finished such as by polishing to obtain a constant thickness. Note that the mirror finishing such as polishing is not necessarily required. After appropriately processing the wafer by treatment such as washing, a metal film is deposited and patterned on the wafer by techniques such as photolithography and metal masking to form the excitation electrodes 5 and 6, the extraction electrodes 19 and 20, the mount electrodes 7 and 8, and the side electrode 15. This completes the fabrication of a plurality of piezoelectric vibrating pieces 4.

Figure 8:
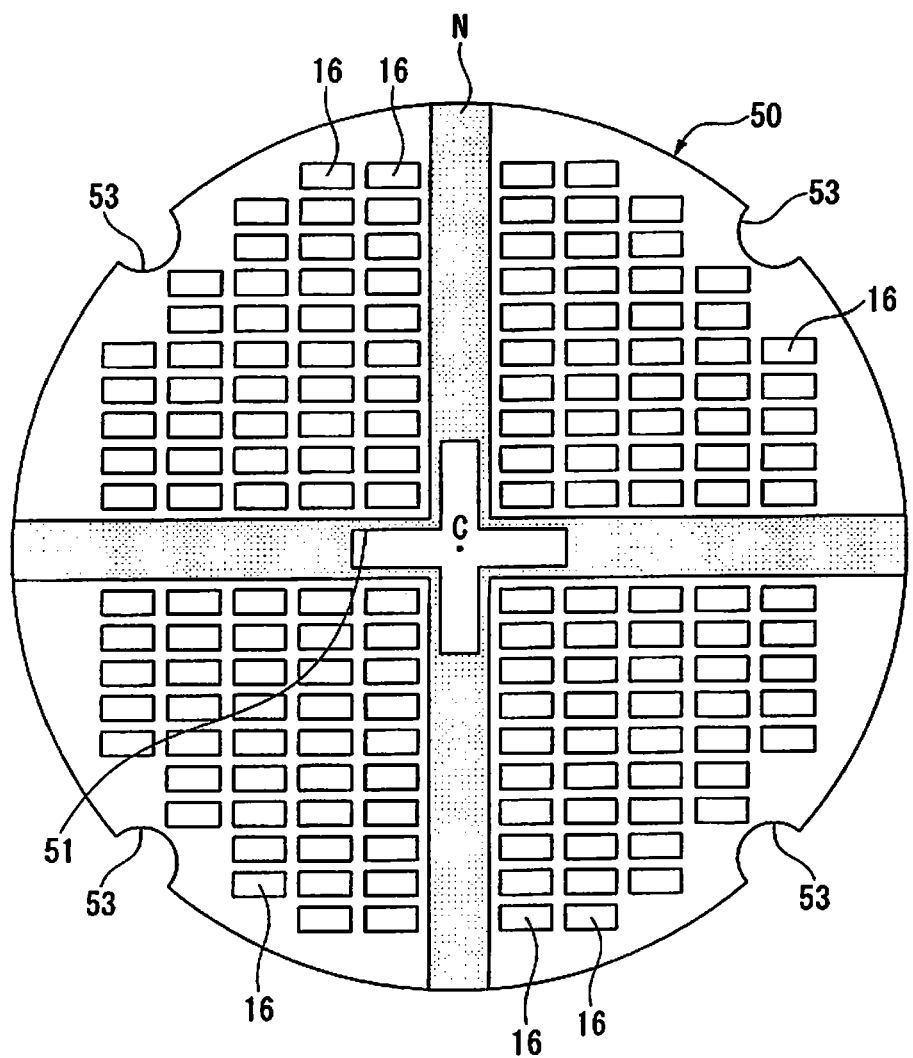
FIG. 8 is an illustration of one of the manufacturing steps of forming a piezoelectric vibrator along the flow chart of FIG. 7, showing a state in which a plurality of depressions is formed in a lid substrate wafer formed into a lid substrate.

Then, a first wafer fabrication step is performed in which the lid substrate wafer 50 to be the lid substrate 3 is fabricated to make it usable for anodic bonding (S20). First, the lid substrate wafer 50, made of soda-lime glass, is polished to a predetermined thickness, and after washing, a disk-shaped lid substrate wafer 50 is formed from which the work-affected layer on the outermost surface has been removed by etching or the like, as illustrated in FIG. 8 (S21). This is followed by a depression forming step in which a plurality of depressions 16 to provide cavities is formed by methods such as etching and embossing in the row and column directions on the bonding face of the lid substrate wafer 50 (S22). Note that the rigidity of the lid substrate wafer 50 is ensured by the provision of a devoid region N, a substantially cross-shaped region devoid of the depressions 16, including a central portion C of the lid substrate wafer 50.

The through hole 51 of a substantially cross shape is formed in the devoid region N (S23). The through hole 51 is formed by methods such as etching and embossing at substantially the same time as forming the depressions 16. Substantially semicircular cutout portions 53 are formed at substantially regular intervals along the circumferential direction of the lid substrate wafer 50 at four locations (S24). The cutout portions 53 are formed by methods such as etching and embossing at substantially the same time as forming the depressions 16 and the through hole 51.

Figure 9A:
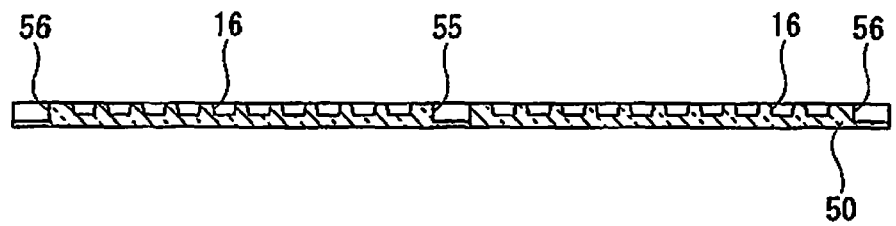
FIGS. 9A and 9B are explanatory diagrams of one of the manufacturing steps of forming a piezoelectric vibrator along the flow chart of FIG. 7, explaining how a through hole and cutout portions are formed in a lid substrate wafer formed into a lid substrate.
Figure 9B:
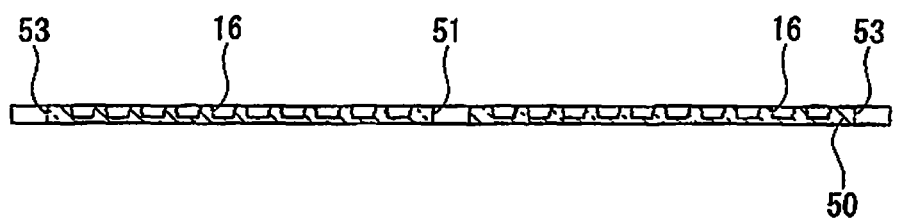

As an example of forming the through hole 51 and the cutout portions 53, as illustrated in FIG. 9A, recesses 55 and 56 deeper than the depressions 16 are formed in advance when forming the depressions 16, and the surface not having the depressions 16 is polished to form the through hole 51 and the cutout portions 53 from the recesses 55 and 56, respectively, as illustrated in FIG. 9B.

After forming the depressions 16, the through hole 51, and the cutout portions 53, the surface having the depressions 16 is polished (S25) in preparation for the bonding step (S60). This completes the first wafer fabrication step.

Figure 10:
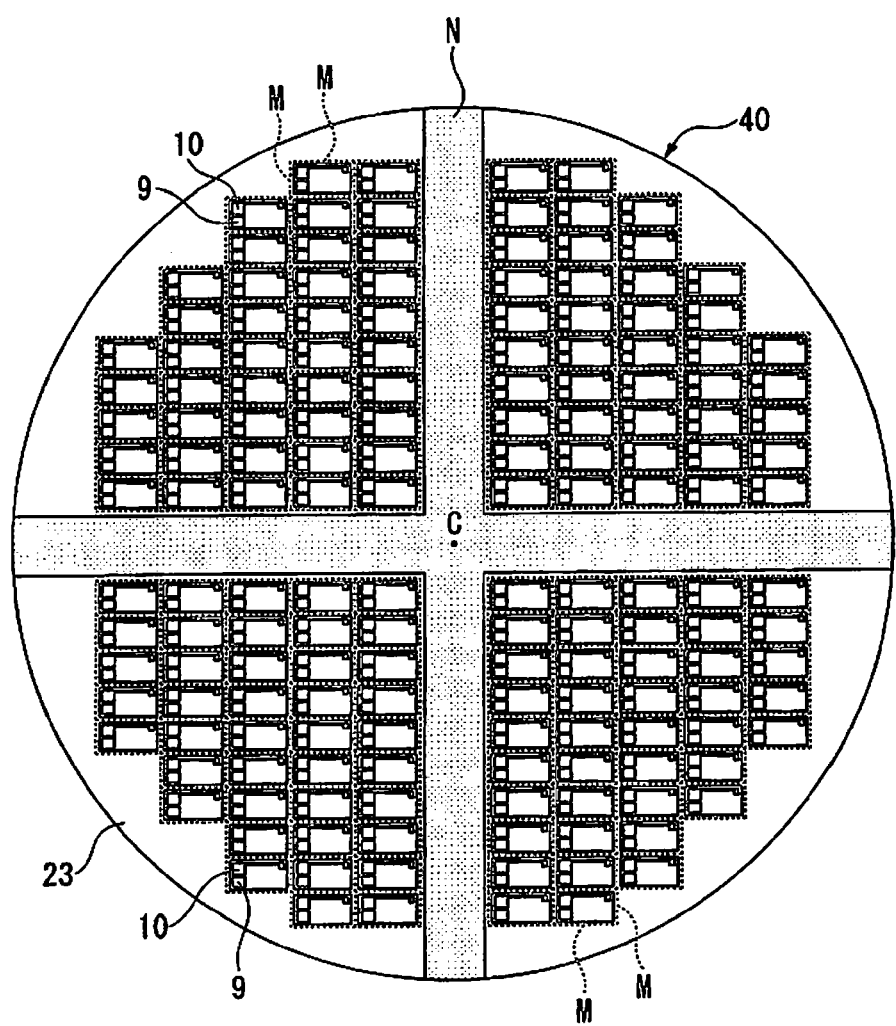
FIG. 10 is an illustration of one of the manufacturing steps of forming a piezoelectric vibrator along the flow chart of FIG. 7, showing a state in which a bonding film and inner electrodes are patterned on the upper surface of a base substrate wafer.

Concurrently with, or before or after this step, a second wafer fabrication step is performed in which the base substrate wafer 40 to be the base substrate 2 is fabricated to make it usable for anodic bonding (S30). First, soda-lime glass is polished to a predetermined thickness, and after washing, a disk-shaped base substrate wafer 40 is formed from which the work-affected layer on the outermost surface has been removed by etching or the like (S31). This is followed by a through electrodes forming step in which the pairs of through electrodes 13 and 14 are formed in the base substrate wafer 40 (S32). Here, as with the lid substrate wafer 50, rigidity is ensured by the provision of a devoid region N, a substantially cross-shaped region devoid of the through electrodes 13 and 14, including a central portion C of the base substrate wafer 40, as illustrated in FIG. 10.

Figure 11:
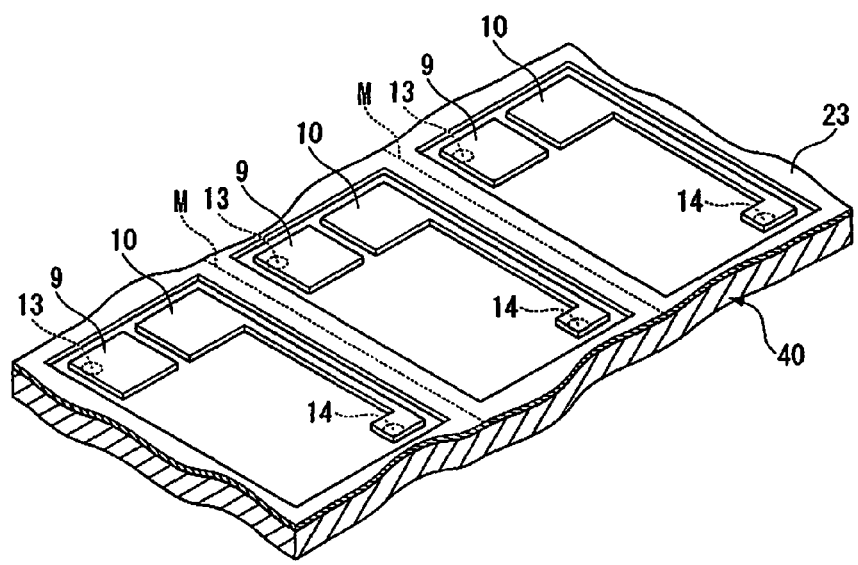
FIG. 11 is a partially enlarged view (perspective view) of FIGS. 9A and 9B.

Next, conductive material is patterned on the upper surface of the base substrate wafer 40 to form the bonding film 23 (bonding film forming step; S33) and the inner electrodes 9 and 10 electrically connected to the through electrodes 13 and 14, respectively (inner electrodes forming step; S34), as illustrated in FIGS. 10 and 11. Note that the dotted lines M shown in FIGS. 10 and 11 are cutting lines used in the subsequent cutting step.

The through electrodes 13 and 14 are substantially flush with the upper surface of the base substrate wafer 40, as described above. Accordingly, the inner electrodes 9 and 10 patterned on the upper surface of the base substrate wafer 40 are closely in contact with the through electrodes 13 and 14 without any gap or space. This ensures conductivity between the one inner electrode 9 and the one through electrode 13, and between the other inner electrode 10 and the other through electrode 14. This completes the second wafer fabrication step.

In FIG. 7, the inner electrodes forming step (S34) is performed after the bonding film forming step (S33); however, the bonding film forming step (S33) may be performed after the inner electrodes forming step (S34), or these steps may be performed simultaneously. The same effect can be obtained regardless of the order of the steps. Accordingly, the order of these steps may be changed appropriately, as needed.

Then, the piezoelectric vibrating pieces 4 fabricated as above are bonded to the upper surface of the base substrate wafer 40 via their respective inner electrodes 9 and 10 (mount step; S40). First, the bumps 11 and 12 are formed on the inner electrodes 9 and 10, respectively, using gold wires.

Then, with the basal portion of the piezoelectric vibrating piece 4 placed on the bumps 11 and 12, the piezoelectric vibrating piece 4 is pressed against the bumps 11 and 12 while heating the bumps 11 and 12 to a predetermined temperature. In this way, the bumps 11 and 12 provide mechanical support for the piezoelectric vibrating piece 4, and the mount electrodes 7 and 8 and the inner electrodes 9 and 10 are electrically connected to each other, respectively. Further, the bump bonding of the mount electrode 7 of the crystal plate 17 on the bump 11, and the bump bonding of the mount electrode 8 of the crystal plate 17 on the bump 12 supports the crystal plate 17 parallel to the base substrate 2. As a result, the piezoelectric vibrating piece 4 is supported by being suspended above the base substrate wafer 40. Here, the excitation electrodes 5 and 6 of the piezoelectric vibrating piece 4 conduct to the through electrodes 13 and 14, respectively.

After the piezoelectric vibrating piece 4 is mounted, a mating step is performed in which the lid substrate wafer 50 is mated with the base substrate wafer 40 (S50). Specifically, the wafers 40 and 50 are aligned in position using reference marks or the like (not shown) as a marker. As a result, the piezoelectric vibrating piece 4 mounted as above is housed in the cavity 16 surrounded by the wafers 40 and 50.

After the mating step, the mated two wafers 40 and 50 are placed in the anodic bonding machine 60 to perform a bonding step in which the two wafers are anodically bonded together under application of a predetermined voltage in an atmosphere of a predetermined temperature in a vacuum (S60).

Figure 12:
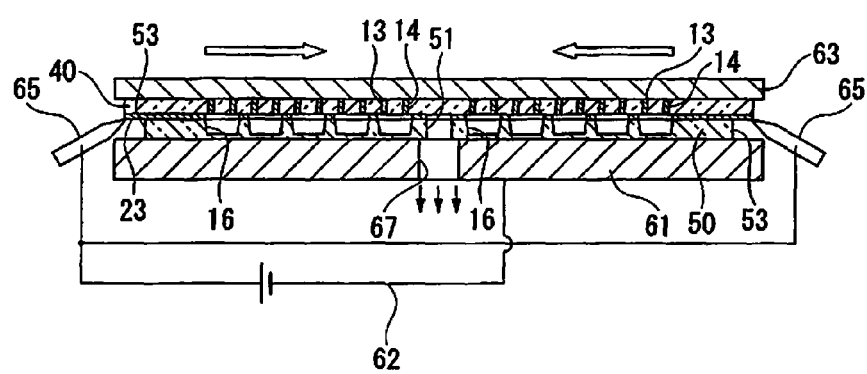
FIG. 12 is an illustration of one of the manufacturing steps of forming a piezoelectric vibrator along the flow chart of FIG. 7, showing a state in which a pair of wafers is set in an anodic bonding machine.

Specifically, as illustrated in FIG. 12, the stacked layers of the two wafers 40 and 50 are placed on the lower jig 61. Here, placement is made in such a manner that the gas vent 67 of the lower jig 61 is in communication with the through hole 51 of the lid substrate wafer 50. The upper jig 63 is then placed on the base substrate wafer 40. In this manner, the two wafers 40 and 50 are sandwiched between the lower jig 61 and the upper jig 63. Then, the electrodes 65 provided on the other end of the power wire 62 are connected to the bonding film 23. The electrodes 65 are connected to the bonding film 23 in the exposed portions corresponding to portions of the lid substrate wafer 50 where the cutout portions 53 are formed.

With the two wafers 40 and 50 set in the anodic bonding machine 60, a predetermined voltage is applied between the bonding film 23 and the lid substrate wafer 50. This causes an electrochemical reaction at the interface between the bonding film 23 and the lid substrate wafer 50, anodically bonding the two with tight adhesion.

In this embodiment, voltage is applied with the electrodes 65 connected to the bonding film 23 at four locations. Thus, anodic bonding starts substantially at the same time at these four locations, and progresses one after another towards the central portion C of the wafers 40 and 50. Here, because of the through hole 51 formed at substantially the central portion of the lid substrate wafer 50, the wafers 40 and 50 are prevented from being distorted during the course of anodic bonding. Further, the oxygen generated during the anodic bonding can be released out of the anodic bonding machine 60 from the through hole 51 through the gas vent 67. This ensures that the cavity 16 is maintained in a vacuum. Further, by applying voltage at four locations, the value of the current that flows at one location can be reduced to ¼, thus preventing damage to the bonding film 23 under high current.

Figure 13:
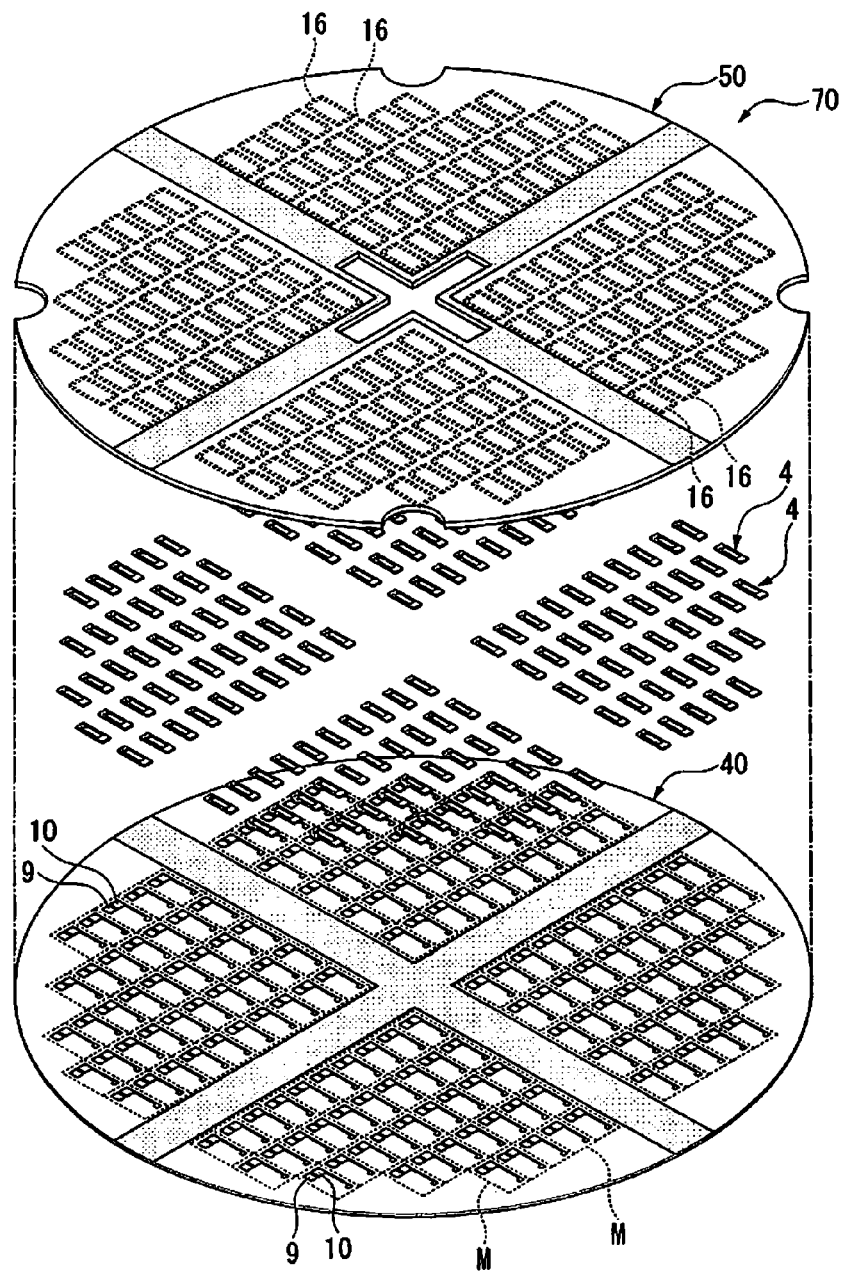
FIG. 13 is an exploded perspective view of one of the manufacturing steps of forming a piezoelectric vibrator along the flow chart of FIG. 7, showing a wafer unit formed by the anodic bonding of a base substrate wafer and a lid substrate wafer with the piezoelectric vibrating piece housed in the cavity.

By the anodic bonding of the two wafers 40 and 50, the piezoelectric vibrating piece 4 is sealed inside the cavity 16 maintained in a vacuum, and a wafer unit 70 in which the base substrate wafer 40 and the lid substrate wafer 50 are bonded together is obtained, as illustrated in FIG. 13. Note that, in FIG. 13, the wafer unit 70 is illustrated in an exploded view, and the bonding film 23 of the base substrate wafer 40 is omitted for ease of illustration. The dotted lines M in FIG. 13 are cutting lines used in the subsequent cutting step.

At the time of anodic bonding, the through holes 24 and 25 formed in the base substrate wafer 40 are completely closed by the through electrodes 13 and 14, and therefore the sealing of the cavity C will not be lost through the through holes 24 and 25.

After anodic bonding, an external electrodes forming step is performed in which conductive material is patterned on the lower surface of the base substrate wafer 40 to form the pairs of external electrodes 21 and 22 electrically connected to the pairs of through electrodes 13 and 14, respectively (S70). The external electrodes 21 and 22 formed in this step can then be used to activate the piezoelectric vibrating piece 4 sealed inside the cavity 16.

As in the case of the inner electrodes 9 and 10, because the through electrodes 13 and 14 are substantially flush with the lower surface of the base substrate wafer 40, the external electrodes 21 and 22 patterned in this step are closely in contact with the through electrodes 13 and 14 without any gap or space. This ensures conductivity between the external electrodes 21 and 22 and the through electrodes 13 and 14.

Next, a cutting step is performed in which the wafer unit 70 bonded as above is cut into individual pieces along the cutting lines M shown in FIG. 13 (S80). As a result, a plurality of bilayer, surface-mounted piezoelectric vibrators 1 illustrated in FIG. 1 is manufactured at once, each sealing the piezoelectric vibrating piece 4 in the cavity 16 formed between the anodically bonded base substrate 2 and lid substrate 3.

This is followed by an internal electrical characteristics test (S90). Specifically, measurement is made to check properties of the piezoelectric vibrating piece 4, such as resonant frequency, resonant resistance, and drive level characteristics (excitation power dependence of resonant frequency and resonant resistance). Other properties, such as insulation resistance characteristics are also checked. Then, the piezoelectric vibrator 1 is subjected to an appearance test to check the dimensions, quality, and other conditions of the product. The manufacture of the piezoelectric vibrator 1 is finished upon completion of the checking.

According to the present embodiment, because the through hole 51 is formed at the central portion of the lid substrate wafer 50, no distortion occurs at the central portion C of the wafers 40 and 50 during the anodic bonding performed by applying voltage at four locations corresponding to the circumferential portions of the wafers 40 and 50 stacked together in layers. Specifically, because the through hole 51 formed at the central portion C of the lid substrate wafer 50 provides an escape for the distortion in the wafers, anodic bonding is ensured over substantially the whole area of the wafers 40 and 50. The anodic bonding of the wafers 40 and 50 is therefore stable, and the yield can be improved.

Further, because the anodic bonding employs a plurality of electrodes 65, the value of the current that flows in the electrodes 65 per location can be suppressed. This ensures anodic bonding over substantially the whole area of even larger wafers.

Further, because the through hole 51 is formed in the devoid region N of the piezoelectric vibrator 1 in the lid substrate wafer 50, there will be no reduction in the number of piezoelectric vibrators 1 that can be produced from the wafers 40 and 50. Thus, the piezoelectric vibrator 1 can be produced without lowering production efficiency while ensuring anodic bonding.

Further, because the lower jig 61 of the anodic bonding machine 60 is provided with the gas vent 67 in communication with the through hole 51 of the lid substrate wafer 50, it is ensured that the gas (oxygen) generated during the anodic bonding can be released from the through hole 51 through the gas vent 67. This ensures that the cavity 16 is maintained in a vacuum during the anodic bonding of the wafers 40 and 50.

By applying voltage at a plurality of locations as in the present embodiment, the value of the current that flows per location can be reduced. This prevents the flow of a large current at one location, and thus prevents damage to the bonding film, further ensuring anodic bonding.

Oscillator

An embodiment of an oscillator that uses the glass-sealed package according to the present invention is described below with reference to FIG. 14.

Figure 14:
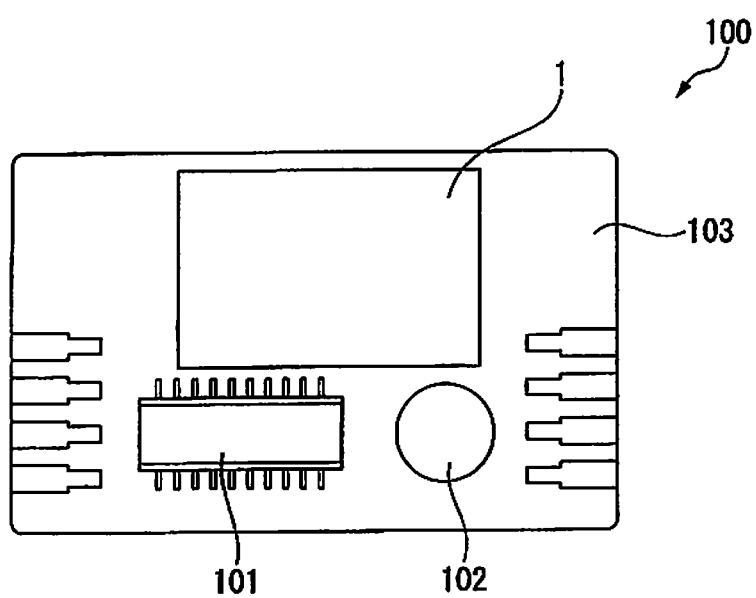
FIG. 14 is a schematic diagram illustrating an oscillator of an embodiment of the present invention.

As illustrated in FIG. 14, an oscillator 100 is structured to include the piezoelectric vibrator 1 provided as a resonator electrically connected to an integrated circuit 101. The oscillator 100 includes a substrate 103 on which electronic components 102 such as capacitors are mounted. The integrated circuit 101 for the oscillator is mounted on the substrate 103, and the piezoelectric vibrator 1 is mounted in the vicinity of the integrated circuit 101. The electronic components 102, the integrated circuit 101, and the piezoelectric vibrator 1 are electrically connected to one another through wiring patterns (not shown). Note that each of these constituting elements is resin molded (not shown).

In the oscillator 100 of this construction, applying a voltage to the piezoelectric vibrator 1 causes the piezoelectric vibrating piece 4 in the piezoelectric vibrator 1 to vibrate. The vibration is transduced into an electrical signal by the piezoelectric characteristics of the piezoelectric vibrating piece 4, and input to the integrated circuit 101 as the electrical signal. The input electrical signal undergoes various processes in the integrated circuit 101, and output as a frequency signal. In this way, the piezoelectric vibrator 1 serves as a resonator.

Further, by configuring the integrated circuit 101 to be selectable according to requirements, for example, such as in an RTC (real-time clock) module, the oscillator can be provided not only as devices such as a single-function oscillator for clocks, but with additional functions, such as the control of operation date and time and the provision of a clock and a calendar, for these and external devices.

As described above, the oscillator 100 of the present embodiment has high quality by virtue of using the piezoelectric vibrator 1 in which a vacuum is ensured inside the cavity 16, and in which anodic bonding is ensured between the base substrate 2 and the lid substrate 3. Further, because the piezoelectric vibrator 1 can be produced with improved yield, the yield of the oscillator 100 is also improved.

It should be noted that the present invention is not limited to the embodiment described above, and various modifications of the embodiment that do not depart from the substance of the present invention are intended to be within the scope of the invention.

For example, the piezoelectric vibrating piece exemplified as using an AT vibrating piece (thickness shear vibrating piece) in the foregoing embodiment may be adapted to use a tuning-fork piezoelectric vibrating piece. Further, the invention is applicable not only for piezoelectric vibrators, but also for structures produced by the anodic bonding of a pair of wafers.

Figure 15A:
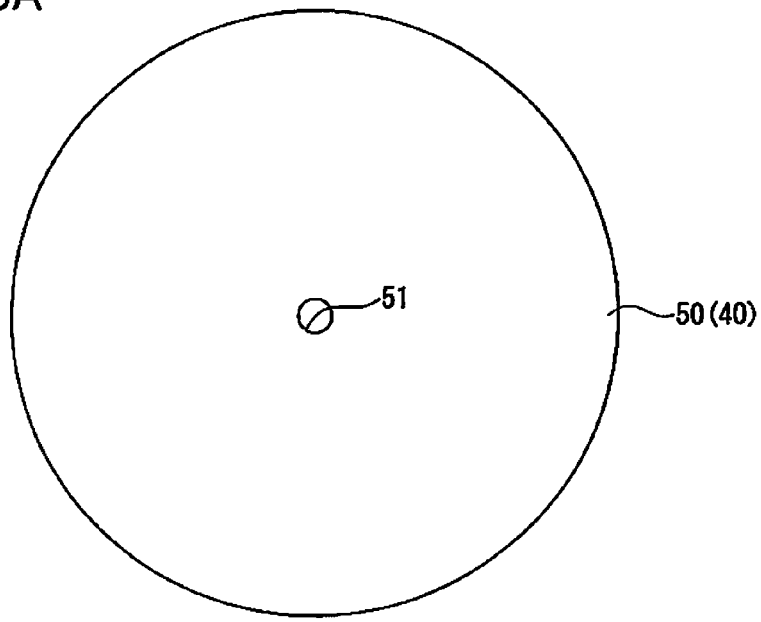
FIGS. 15A and 15B are plan views illustrating another embodiment of a through hole formed in the wafer of an embodiment of the present invention.
Figure 15B:
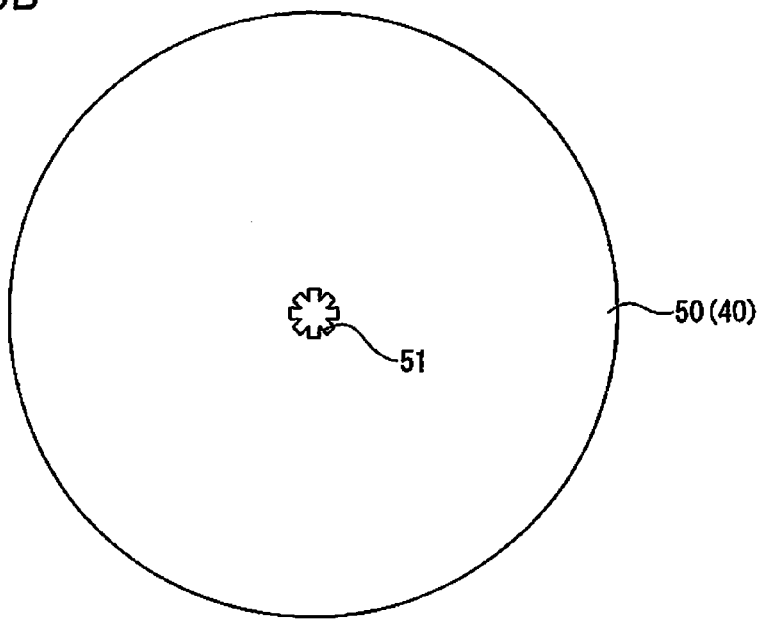

Further, the through hole 51 described as having a cross shape in the foregoing embodiment may have a circular shape or the shape of two crosses overlaid in a staggered fashion, as illustrated in FIGS. 15A and 15B.

Figure 16:
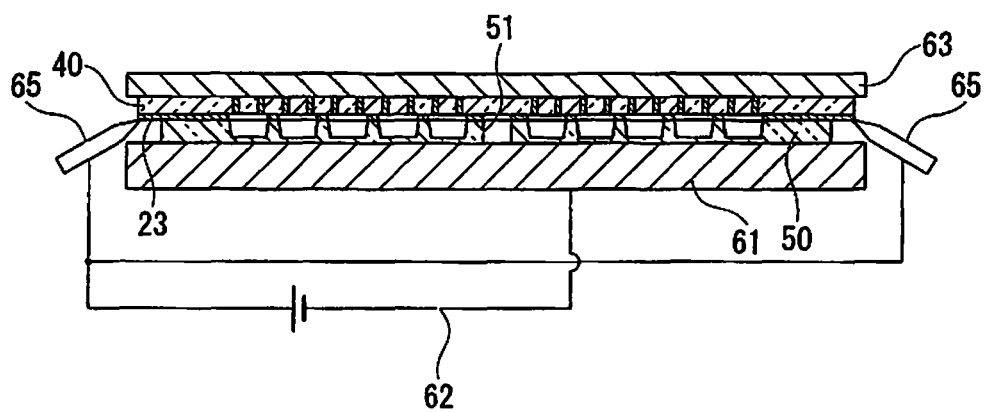
FIG. 16 is a schematic diagram illustrating another embodiment of a through hole and a gas vent of an embodiment of the present invention.

Further, the lower jig described as having a gas vent in this embodiment may not be provided with a gas vent, as illustrated in FIG. 16. However, in this case, the through hole 51 is sized to have a volume that can contain the gas generated during the anodic bonding.

Figure 17:
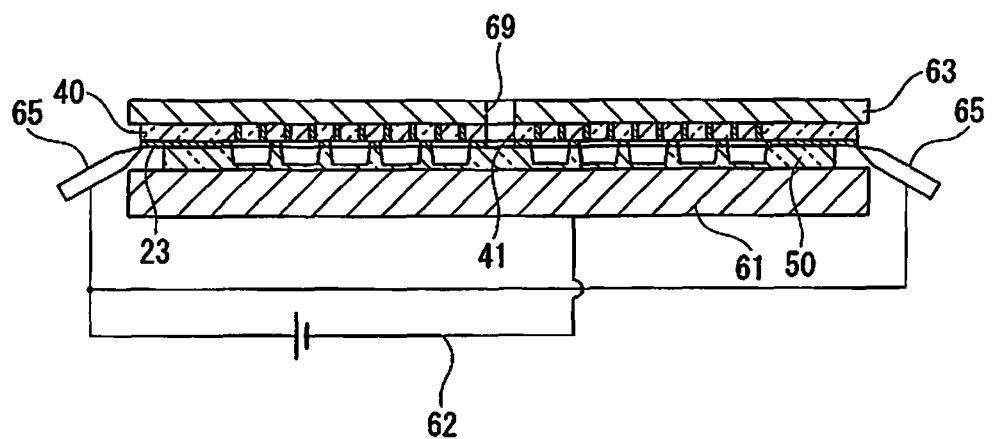
FIG. 17 is a schematic diagram illustrating yet another embodiment of a through hole of an embodiment of the present invention.
Figure 18:
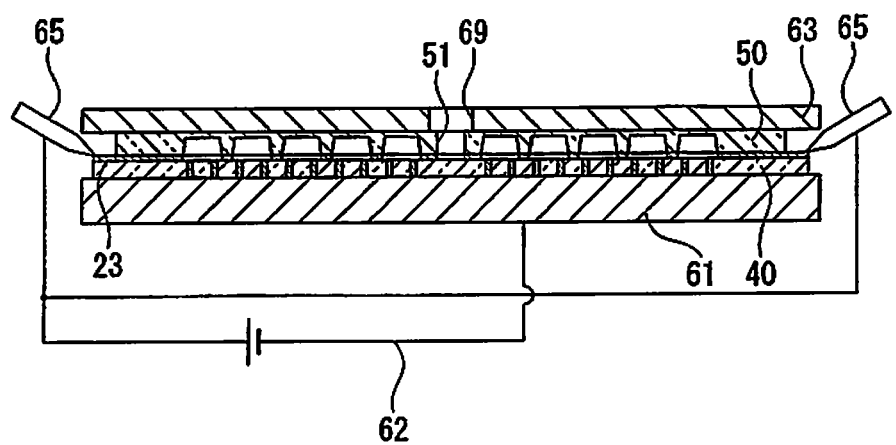
FIG. 18 is a schematic diagram illustrating yet another embodiment of a through hole and a gas vent of an embodiment of the present invention.

Further, in the foregoing embodiment, the through hole is formed in the lid substrate wafer, and the gas vent matching the through hole is formed in the lower jig. However, as illustrated in FIG. 17, a through hole 41 may be formed in the base substrate wafer 40, and a gas vent 69 matching the through hole 41 may be formed in the upper jig 63. Further, as illustrated in FIG. 18, with the base substrate wafer 40 placed on the lower jig 61, the gas vent 69 may be formed in a portion of the upper jig 63 in communication with the through hole 51 of the lid substrate wafer 50. Further, instead of forming the through hole and the gas vent in one of the wafers and the jigs, the through hole and the gas vent may be formed in the both wafers and jigs.

Further, the electrodes 65 disposed at positions equally spaced apart along the circumferential direction of the wafers in the foregoing embodiment are not necessarily required to be equally spaced apart, as long as distortion at the central portion C of the wafers 40 and 50 is prevented.

What is claimed is:

1. A method for manufacturing a glass-sealed package, comprising:

stacking a pair of wafers, at least one of which includes a through hole in a central portion of the wafer;

anodically bonding the pair of wafers by holding the wafers between a pair of jigs and applying voltage at positions corresponding to circumferential portions of the wafers, using a plurality of electrodes disposed at the positions corresponding to the circumferential portions of the wafers, wherein the one of the jigs includes a gas vent in communication with the through hole; and dividing the pair of anodically bonded wafers into individual pieces.

2. The method for manufacturing a glass-sealed package according to claim 1, wherein the plurality of electrodes is disposed at positions equally spaced apart along a circumferential direction with respect to the central portion of the wafers.

3. The method for manufacturing a glass-sealed package according to claim 1, wherein the through hole is formed in a devoid region of the glass-sealed package in the wafer.

4. An apparatus for manufacturing a glass-sealed package by anodically bonding a pair of wafers, the apparatus comprising:

a pair of jigs configured to hold the pair of wafers therebetween, wherein at least one of the wafers includes a through hole at the central portion thereof, and wherein one of the jigs includes a gas vent in communication with the through hole; and a plurality of electrodes disposed at positions corresponding to circumferential portions of the wafers and configured to apply voltage at positions equally spaced apart along a circumferential direction with respect to a central portion of the wafers.

5. An oscillator, comprising:

a piezoelectric vibrator including a piezoelectric vibrating piece housed inside a glass-sealed package manufactured by the manufacturing method of claim 1; and an integrated circuit electrically connected to the piezoelectric vibrator provided as a resonator.

* * * * *